United States Patent [19]

Matsui et al.

[11] Patent Number: 4,469,424

[45] Date of Patent: Sep. 4, 1984

[54] METHOD AND SYSTEM FOR DEVELOPING A PHOTO-RESIST MATERIAL USED AS A RECORDING MEDIUM

[75] Inventors: Fumio Matsui; Mitsuaki Sashida; Toshihiro Komaki; Atsushi Yoshizawa, all of Tokorozawa, Japan

[73] Assignee: Pioneer Electronic Corporation, Tokyo, Japan

[21] Appl. No.: 396,073

[22] Filed: Jul. 7, 1982

[30] Foreign Application Priority Data

Jul. 8, 1981 [JP] Japan .............................. 56-107431
Jul. 17, 1981 [JP] Japan .............................. 56-112556

[51] Int. Cl.³ .............................................. G03D 3/06
[52] U.S. Cl. ................................... 354/298; 354/317; 354/325; 134/57 R; 134/151; 430/30
[58] Field of Search ............... 354/298, 317, 324, 325; 134/56 R, 57 R, 113, 140, 149, 151, 1, 18; 430/30; 369/54, 125, 126; 250/571

[56] References Cited

U.S. PATENT DOCUMENTS

| | | | |
|---|---|---|---|
| 3,388,652 | 6/1968 | Parrent | 354/298 |
| 3,663,724 | 5/1972 | Benton et al. | 134/113 |
| 3,680,463 | 8/1972 | Attridge et al. | 354/298 |
| 3,702,277 | 11/1972 | Lerner | 134/57 R |
| 3,990,088 | 11/1976 | Takita | 354/298 |
| 3,995,959 | 12/1976 | Shaber | 354/298 |
| 4,119,989 | 10/1978 | Carvalko et al. | 354/298 |
| 4,128,325 | 12/1978 | Melander et al. | 354/324 |
| 4,136,940 | 1/1979 | Lin | 354/298 |

*Primary Examiner*—A. A. Mathews
*Attorney, Agent, or Firm*—Fleit, Jacobson, Cohn & Price

[57] ABSTRACT

Disclosed is a method and a system for developing a photo-resist material of an optical recording medium on which digital information is recorded in the form of a series of pits whose position and length represent the digital information. In order to precisely control the size of the pits formed during the developing process, and to reduce the deviation from one recording medium to another, a monitoring beam is applied on the recording medium during the developing process. A diffraction beam of the monitoring energy beam passes through the pits, and is received by a sensor means which monitors the intensity of the diffraction beam and which produces a signal for controlling the supply of developing solution on the recording medium.

8 Claims, 5 Drawing Figures

METHOD AND SYSTEM FOR DEVELOPING A PHOTO-RESIST MATERIAL USED AS A RECORDING MEDIUM

BACKGROUND OF THE INVENTION

1. Field of the Invention

The present invention relates to a method and a system for developing photo-resist material used as a recording medium of an optical recording means such as an optical recording disc.

2. Description of Prior Art

In the recent years, optical recording systems have become popularly used for recroding various information such as video signals and digital audio signals.

In a video disc player system or a compact digital audio disc player system, a laser beam is focused on the surface of a rotating disc having an optical pattern such as a series of pits or projections which represents recorded information.

A reflection beam from the optical pattern on the disc is received by a photoelectric transducer which produces an electric output of a playback signal corresponding to the recorded information.

A master disc of this system comprises a glass base whose surface is polished, and a layer of a photo-resist material formed thereon.

At the time of recording, a recording laser beam, which is modulated in accordance with a signal indicative of the information to be recorded, is focused on the photo-resist layer of the master disc which is rotated at a predetermined high speed and which simultaneously is slowly translated along a radial axis thereof. After passing through such an exposure process, the photo-resist material of the disc is treated in a developing process, where the exposed protions of the photo-resist material are removed by a developing solution to engrave a series of pits representing the recorded information.

Using the thus produced master disc, playback discs are manufactured in large quantities in much the same manner as conventional analog recores.

Since the size of the pits formed by the developing process (i.e., the depth and width of the pits) is a factor which directly affects the precision of the playback operation, pit information must be controlled to be within a predetermined range of allowance.

In order to control the size of the pits, it is necessary to adjust the time of developing, that is, the time duration of chemical reaction on the exposed portions of the photo-resist material. The speed of the chemical reaction, however, is affected by various parameters such as the degree of exposure, the density and the temperature of the developing solution, and so on.

In the case of prior art developing methods and systems, the advancement of the chemical reaction is not monitored, and hence there is a problem that the size of the pits tends to vary from one disc to another.

SUMMARY OF THE INVENTION

An object of the invention is therefore to eliminate the above-described drawback of the prior art developing methods and systems, and to provide a method and a system for developing a photo-resist material in which the advancement of the chemical reaction is monitored so as to control the size of the pits within a predetermined allowable range.

To this end, the present invention contemplates the addtitional steps of supplying a monitoring energy beam of a predetermined wave length and at angle of incidence greater or smaller than 90°, on the sensitive layer covering the base being developed, detecting the intensity of a diffraction beam of the monitoring energy beam passing through the pits, producing a diffraction intensity signal from the passed diffraction beam, and controlling the supply of the developing solution in accordance with the diffraction intensity signal. According to another aspect of the present invention, there is contemplated a system including a supply means for supplying a monitoring energy beam of a predetermined wavelength on the sensitive layer of the base being developed, at an angle of incidence greater or smaller than 90°, a detection means for detecting the intensity of a diffraction beam of monitoring energy beam passing through the pits and producing a diffraction intensity signal, and a control means for controlling the supply of the developing solution in accordance with the diffraction intensity signal.

The foregoing and other objects and advantages of the present invention will become more clearly understood upon review of the following description taken in conjunction with the accompanying drawings.

DETAILED DESCRIPTION OF PREFERRED EMBODIMENTS

Figure 1:
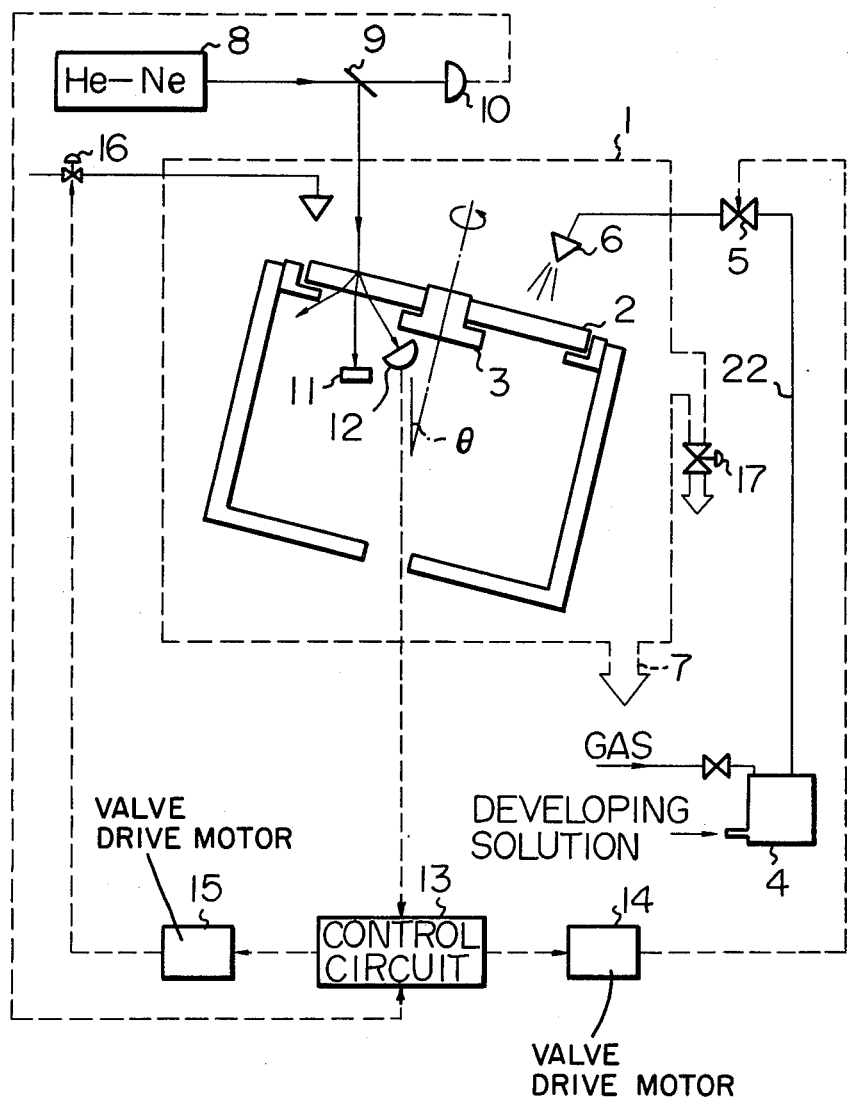
FIG. 1 is a schematic diagram of a first embodiment of a developing system according to the present invention.

Reference is first made to FIG. 1 in which the first embodiment of the developing system according to the present invention is schematically illustrated.

The developing system comprises a treatment chamber 1 housing a disc 2 which has passed through a laser cutting process, i.e., an exposure to a digitally modulated laser beam. The disc 2 is mounted on a turntable 3.

The turntable 3 is preferably slightly inclined to the direction of gravity by a predetermined angle and is driven at a predetermined constant rotational speed by means of an electric motor (not shown).

The disc has a transparent base made of glass, for example, and a thin film layer of a photo-resist material (the thickness being equal to or less than 2000 Angstroms) formed thereon.

A developing solution is supplied from a developing solution supply means, and is mixed with a pressurized gas such as nitrogen gas in a tank 4. The developing solution pressurized by the nitrogen gas or the mixture thereof is supplied to a nozzle 6 via a conduit 22 and a valve 5, by which the developing solution is sprayed on the surface of the disc 2.

During the developing process, portions of the photo-resist layer on the disc which have been exposed to a spot of the modulated laser beam, are removed by the developing solution supplied from the nozzle 6 and are washed away to form a series of pits on the disc 2 which represents the digital information.

The mixture of the developing solution and gas remaining in the treatment chamber 1 is discharged through a valve 17 disposed on a side wall of the treatment chamber. The other part of the developing solution flows down to the bottom of the treatment chamber 1, and exists through a discharge outlet 7.

A source 8 of a laser beam such as a helium-neon tube is provided at a position outside the treatment chamber 1. A laser beam from the source 8 is directed to the disc 2 via a half mirror 9 so that the laser beam is applied on the disc 2 at an angle of incidence inclined to a direction perpendicular to the disc 2 by a predetermined degree.

The laser beam passing through the half mirror 9 is received by a first photoelectric transducer 10, such as photo-diode or a photoelectric tube, for the purpose of monitoring the laser beam. The output signal of the first photoelectric transducer 10 is applied to a control circuit 13 which will be described hereinafter.

If a pit is not present at the position of the photo-resist layer at which the laser beam is applied, the laser beam passes straight throught the transparent base of the disc 2 and is received by a beam stop 11. Conversely, if a pit is present at the position of the photo-resist layer at which the laser beam is diffracted by the pit and is received by a second photoelectric transducer 12 similar to the first photoelectric transducer 10.

The second photoelectric transducer 12 is disposed at a position away from the axis of the incident beam so as to receive a primary diffraction wave preferably.

An output signal of the second photoelectric transducer 12, which is substantially proportional to the size of the pit being encountered, is applied to the control circuit 13. If the output signal of the second photoelectric transducer 12 reaches a predetermined reference level, the control circuit 13 produces command signals for driving a valve drive motor 14 to close the valve 5, and for driving another valve drive motor 15 to open a valve 16 which controls a supply of pure water to the surface of the disc 2. Thus, since the photo-resist material on the surface of the disc 2 is no longer supplied with the developing solution, the development process is stopped.

Figure 2:
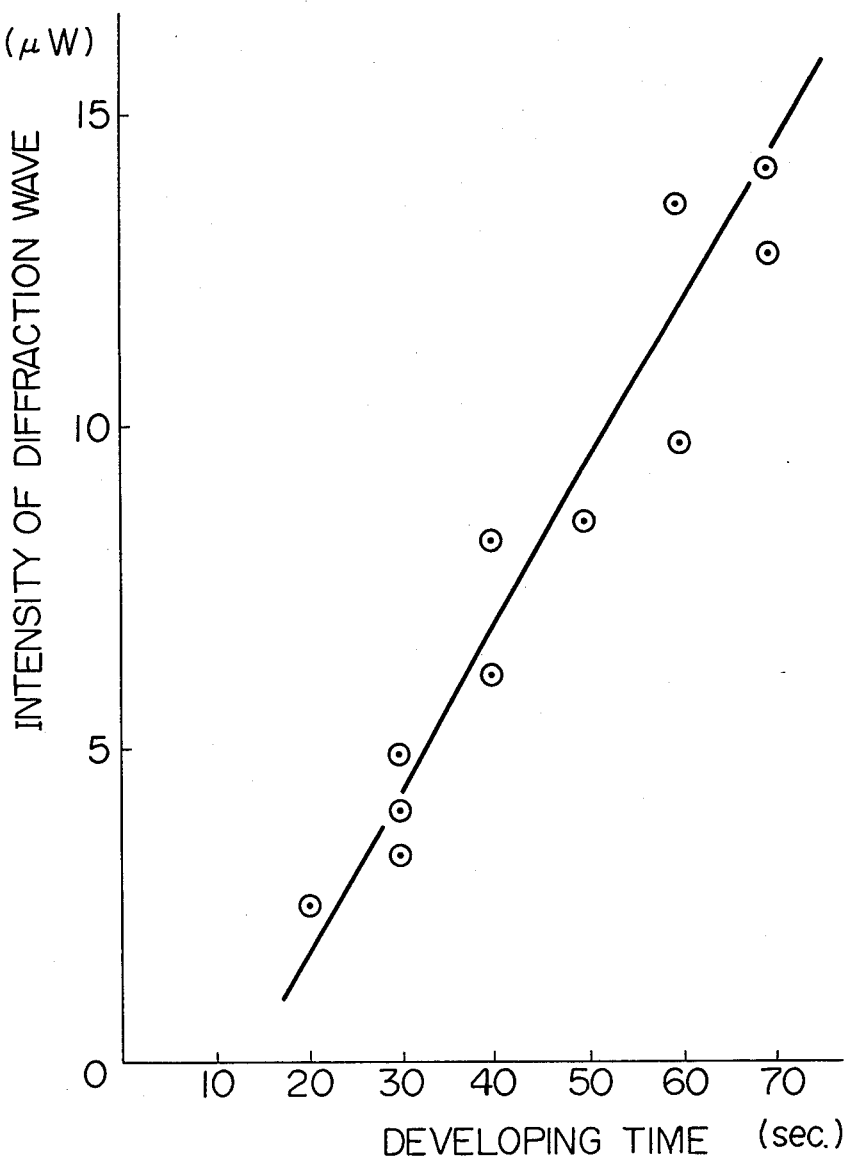
FIG. 2 is a graph showing the intensity of a primary diffraction beam of a laser beam passing through the pits formed on a disc with respect to the developing time in the case of a prior art developing method.

As shown in FIG. 2, which depicts the relationship of the intensity ($\mu W$) of the diffraction beam and the developing time in the case of a prior art method in which the developing time is selected previously, the size of the pits, which is represented by the intensity of the diffraction beam, deviates with respect to time from one disc to another. It therefore should be appreciated that monitoring the size of the pits by means of the intensity of a diffraction beam, rather than merely controlling the time of development, is significantly advantageous. Since the developing time is controlled in accordance with the monitored value of the intensity of the diffraction beam, a precise control of the size of the pits becomes possible in the case of the present invention.

An experiment for varying the parameters of the chemical reaction, such as the degree of exposure and the developing time, during the developing process according to the present invention, has been executed.

Figure 3:
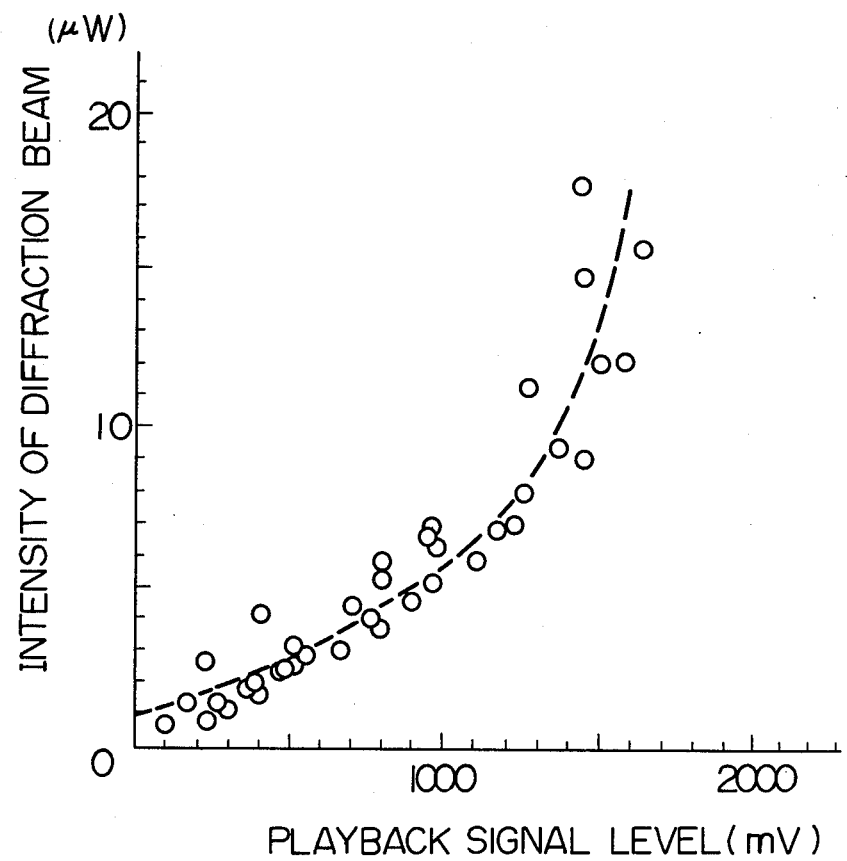
FIG. 3 is a graph showing the relationship between the intensity of a primary diffraction wave of a laser beam passing through the pits formed on a disc and the voltage levels of playback signals of discs developed under various developing conditions.

The results of the experiment are shown in FIG. 3, which depicts the relationship between the output signal levels obtained from a plurality of playback discs produced by using a plurality of master discs manufactured according to the developing method of the present invention, in which the level ($\mu W$) of the diffraction beam takes various settings.

As shown, even if the parameters of the chemical reaction are varied, the relationship between the setting levels of the diffraction beam and the playback signal levels follows an exponential curve.

Figure 4:
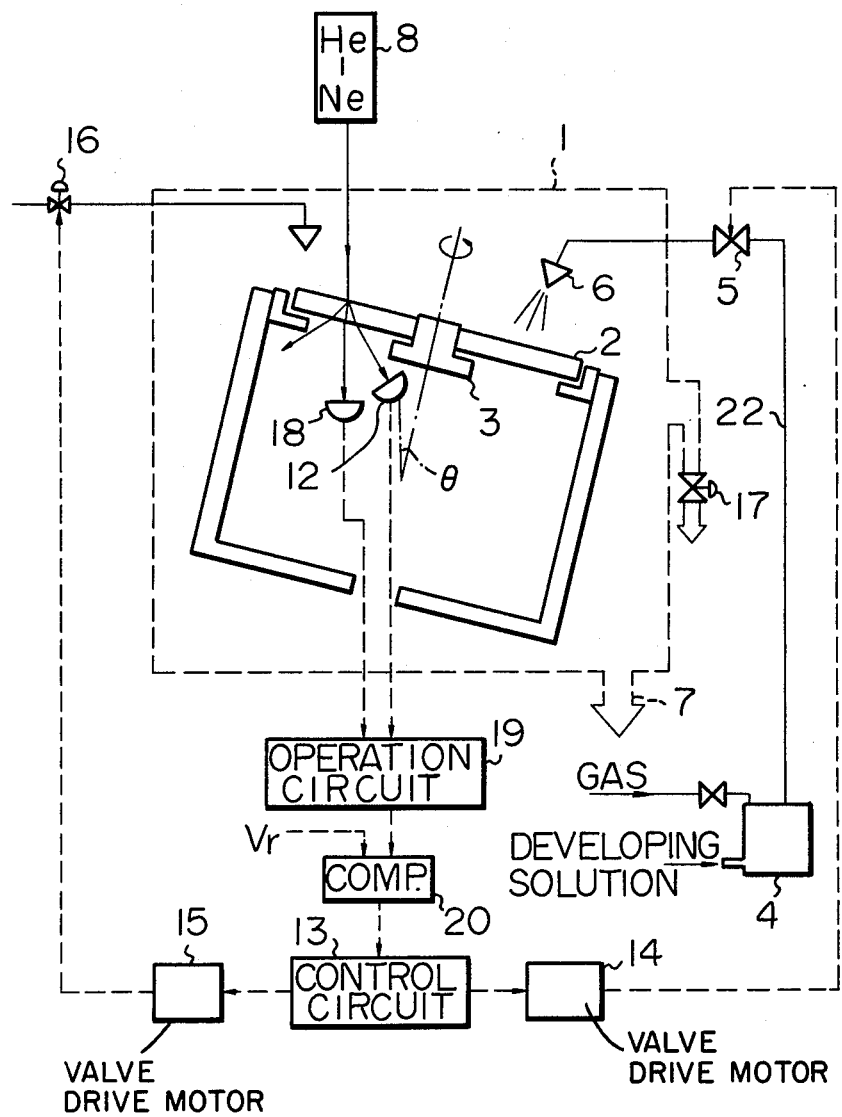
FIG. 4 is a schematic diagram of a second embodiment of the developing system according to the present invention.

Turning to FIG. 4, the second embodiment of the developing system according to the present invention will be described.

The second embodiment features a third photoelectric transducer 18 provided in place of the beam stop 11 shown in FIG. 1. If the pit is not present at the position of the photo-resist layer where the laser beam from the source 8 is applied, the laser beam passes straight through the base of the disc 2, as in the case of the previous embodiment shown in FIG. 1. After passing through the disc 2, however, the laser beam is received by the third photoelectric transducer 18, which produces an output signal proportional to the intensity of the input laser beam. The first photoelectric transducer 10 used in the embodiment of FIG. 1 is omitted in the embodiment shown in FIG. 4.

The output signals of the second and third photoelectric transducers are respectively amplified in magnitude by amplifiers (not shown) and are received by an operational circuit 19 which produces an output signal indicative of the ratio between the intensities of the laser beams received by the respective photoelectric transducers 12 and 18. The output signal of the operational circuit 19 then is applied to a comparator 20 which produces a stop command signal when the output signal of the operational circuit 19 reaches a predetermined reference level Vr. The control circuit 13, upon receiving the stop command signal from the comparator 20, drives the motors 14 and 15 in the same manner as in the first embodiment so as to stop the developing process.

The output signals of the photoelectric transducers 12 and 18 tend to fluctuate by various causes such as absorption, scattering and diffraction of the laser beam, which fluctuations are caused by particles of dust and developing solution. However, in the case of the system shown in FIG. 4, such fluctuation of the output signals of the electric transducers are compensated for at the operation circuit 19 since the fluctuation of the output signals of the photoelectric transducers 12 and 18 occur in the same manner as a result of the above-described disturbance. The output signal of the operation circuit 19 therefore varies solely with the size of the pits, thereby enabling more precise control of the developing process.

Preferably, the above-mentioned amplifiers connected to the photoelectric transducers are adjusted so that their amplification rates vary so as to compensate for the difference of the output characteristics of the photoelectric transducers.

Figure 5:
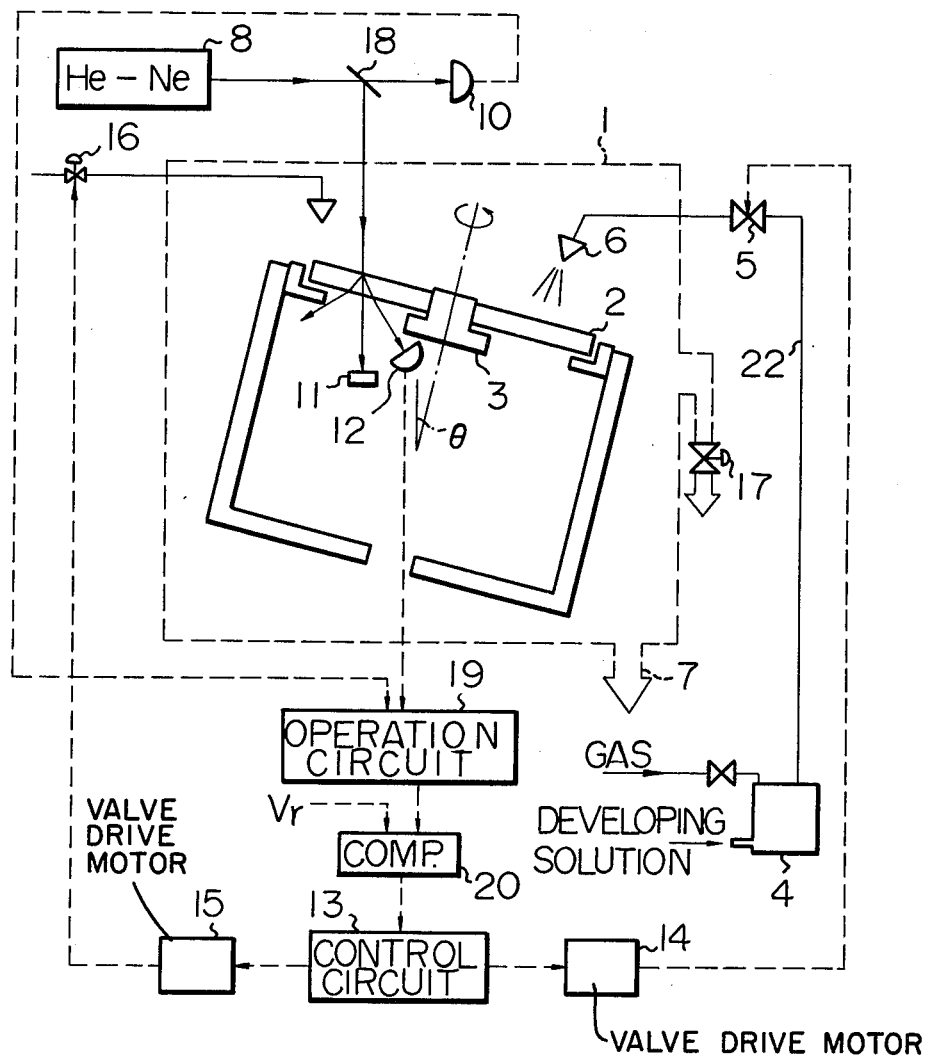
FIG. 5 is a schematic diagram of a third embodiment of the developing system according to the present invention.

Reference now is made to FIG. 5, the third embodiment of the present invention.

In the third embodiment, the output signals of the first and second photoelectric transducers 10 and 23 are applied to the operation circuit 19. Similar to the embodiment of FIG. 4, fluctuation of the intensity of the laser beam from the source 8 is compensated for at the operation circuit 19.

It will be appreciated from the foregoing that a precise control of the size of the pit formed during the developing process is enabled according to the present invention. Furthermore, it is to be noted that the fluctuation of the intensity of the monitoring energy beam which is received by the photoelectric transducer is compensated for by using an operation circuit in which a ratio between a plurality of the output signals of the photoelectric transducers is calculated to produce a development control signal.

Above, preferred embodiments of the present invention have been described. It should be understood, however, that the foregoing description is for illustrative purpose only, and is not intended to limit the scope of the invention. Rather, there are numerous equivalents to the preferred embodiments, and such are intended to be covered by the appended claims.

What is claimed is:

1. A method for developing a photo-resist material of sensitive layer formed on a substantially transparent base of a recording disc, the sensitive layer having been exposed to a recording energy beam modulated in accordance with information to be recorded, the method comprising the steps of:
    rotating said recording disc around an axis inclined with respect to the direction of gravity by a predetermined degree;
    supplying a developing solution on the sensitive layer in atomized form so as to remove the exposed portions of the photo-resist material to form a series of pits which respresents the information to be recorded;
    supplying a monitoring energy beam of a predetermined wavelength on the sensitive layer of the base being developed, at a point of said sensitive layer higher than a portion on which the developing solution is supplied, and at an angle of incidence greater or smaller than 90°;
    detecting the intensity of a diffraction beam of said monitoring energy beam having passed through the pits, and producing a diffraction intensity signal proportional to the intensity of diffraction beam; and
    controlling the supply of the developing solution in accordance with said diffraction intensity signal.

2. A method as recited in claim 1, further comprising the step of detecting the intensity of said monitoring beam and producing a reference intensity signal, and wherein said controlling step includes the step of comparing said diffraction intensity signal with said reference intensity signal and producing a stop command signal to stop the supply of the developing solution when the ratio of said diffraction intensity signal and said reference intensity signal reaches a predetermined value.

3. A method as recited in claim 2, wherein said step of detecting the intensity of said monitoring beam and producing a reference intensity signal is performed by detecting the intensity of said monitoring energy beam before it reaches said sensitive layer.

4. A method as recited in claim 2, wherein said step of detecting the intensity of said monitoring beam and producing a reference intensity signal is performed by detecting the intensity of said monitoring energy beam having passed through the pits.

5. A system for developing a photo-resist material of a sensitive layer formed on a substantially transparent base of a recording disc, the sensitive layer having been exposed to a recording energy beam modulated in accordance with information to be recorded, the system comprising:
    drive means for rotating said recording disc around an axis inclined with respect to the direction of gravity by a predetermined degree;
    means for supplying a developing solution on the sensitive layer in atomized form so as to remove the exposed portions of the photo-resist material to form a series of pits which represents the information to be recorded;
    a light source for supplying a monitoring energy beam of a predetermined wavelength on the sensitive layer of the base being developed, at a point of said sensitive layer higher than a portion on which the developing solution is supplied, and at an angle of incidence greater or smaller an 90°;
    a photo-detector for detecting the intensity of a diffraction beam of said monitoring energy beam having passed through the pits, and producing a diffraction intensity signal proportional to the intensity of diffraction beam; and
    control means for controlling the supply of the developing solution in accordance with said diffraction intensity signal.

6. A system as recited in claim 5, further comprising a second photo-detector for detecting the intensity of said monitoring energy beam and producing a reference intensity signal, and wherein said controlling means comprises means for comparing said diffraction intensity signal with said reference intensity signal and producing a stop command signal to stop the supply of the developing solution when the ratio of said diffraction intensity signal and said intensity signal reaches a predetermined value.

7. A system as recited in claim 6, wherein said second photo-detector is disposed on the same side of said light source with respect to said recording disc so as to detect the intensity of said monitoring energy beam before it reaches said sensitive layer.

8. A system as recited in claim 6, wherein said second photo-detector is disposed on another side of said light source with respect to said recording disc so as to detect the intensity of said monitoring energy beam having passed through the pits.

* * * * *